United States Patent [19]

Miura et al.

[11] Patent Number: 5,407,473
[45] Date of Patent: Apr. 18, 1995

[54] CONDUCTIVE INK

[75] Inventors: Kazuhiro Miura, Osaka; Yoshihiro Bessho, Higashiosaka; Satoru Yuhaku, Osaka; Yasuhiko Hakotani, Nishinomiya; Minehiro Itagaki, Moriguchi; Yoshifumi Nakamura, Neyagawa; Akihiko Miyoshi, Moriguchi, all of Japan

[73] Assignee: Matsushita Electric Industrial Co., Ltd., Osaka, Japan

[21] Appl. No.: 174,807

[22] Filed: Dec. 29, 1993

[51] Int. Cl.$^6$ .............................................. C09D 11/02
[52] U.S. Cl. ................................ 106/20 B; 252/512; 252/518
[58] Field of Search ..................... 106/20 B, 26 R; 252/512, 518

[56] References Cited

U.S. PATENT DOCUMENTS

| | | | |
|---|---|---|---|
| 3,647,532 | 3/1972 | Friedman et al. | 427/229 |
| 4,514,321 | 4/1985 | Siuta | 106/1.18 |
| 4,521,329 | 6/1985 | Siuta et al. | 106/1.14 |
| 4,733,018 | 3/1988 | Prabhu et al. | 106/1.18 |
| 4,868,034 | 9/1989 | Steinberg | 106/1.18 |
| 5,062,891 | 11/1991 | Gruber et al. | 106/20 B |

*Primary Examiner*—Helene Klemanski
*Attorney, Agent, or Firm*—Wenderoth, Lind & Ponack

[57] ABSTRACT

Conductive ink has an inorganic compound comprising 70.0–95.0 wt. % of CuO which is conductive and 5.0–30.0 wt. % of inorganic binder mixed with each other, and solvent and organic binder in which the inorganic compound is dispersed. The inorganic binder consists of lead borosilicate crystalline glass or aluminum borosilicate crystalline glass soften and crystallizes at 850°–950° C. The diameter of CuO powder of the inorganic compound is 100–7.0 μm. The diameter of the lead borosilicate crystalline glass powder or the aluminum borosilicate crystalline glass powder of the inorganic compound is 1.0–5.0 μm. The organic binder consists of ethyl cellulose or copolymer of polyisobytylmethacrylate and polyα-methylstyrene. The conductive ink contains the organic binder at 0.5–2.0 wt. %.

5 Claims, No Drawings

CONDUCTIVE INK

BACKGROUND OF THE INVENTION

1. Field of the Invention

The present invention relates to conductive ink to be applied to an electrode pattern disposed in the inside and outside of a ceramic multi-layer substrate on which a semiconductor LSI, chips and the like are installed and wired.

2. Description of the Related Arts

In recent years, the general tendency is to manufacture compact and light semiconductor LSI and chips and thus, there are growing demands for the manufacture of compact and light wiring substrates on which they are mounted. In such a situation, a great importance is attached to ceramic multi-layer substrates in electronic component-manufacturing trade because semiconductor LSI and chips can be wired in a high density thereon and can be formed to be thin. Conductive materials serving as an electrode to be mounted on the ceramic multi-layer substrate include a paste compound comprising an organic media in which a conductive metal, inorganic oxide and glass powders are dispersed. Owing to the development of the multi-layer substrate made of glass/ceramic to be sintered at a low temperature in recent years, gold, silver, copper, palladium or mixtures thereof have been used as materials of the electrode. Gold, silver, copper and palladium have a lower resistivity than tungsten or molybdenum conventionally used. Further, equipments for manufacturing the multi-layer substrate made of the former is safer than those for manufacturing the multi-layer substrate made of the latter and the multi-layer substrate made of the former can be manufactured at a less expensive cost than multi-layer substrate made of the latter.

Gold, silver, and palladium, which are noble metals, are expensive and the prices thereof fluctuate greatly. Thus, recently, base metals are used more frequently than noble metals because the former is less expensive than the latter and the prices of the former do not fluctuate so greatly as the latter. Above all, copper is most favorably used as a material of an electrode because the resistivity thereof is low and solder-wettability thereof is superior.

According to a method, copper is used as the material of the multi-layer substrate to be sintered at a low temperature, and copper is used as the material of the uppermost and inner layers thereof. This method is preferable in respect to resistance, solder-wettability, and cost. But it is necessary to sinter copper in a neutral atmosphere consisting of such gases as nitrogen and thus it is difficult to prepare a multi-layer substrate of copper. Generally, in composing an electrode of copper, a wiring pattern is formed on a substrate by screen-printing copper paste. After the copper paste is dried, the copper paste is sintered at a temperature (850°–950° C.) less than the melting point of copper in a nitrogen atmosphere in which the oxygen partial pressure is controlled, so that copper is not oxidized and the organic component of the conductive paste can be burned sufficiently burned. In layering a plurality of substrates one on the other, insulating layers are printed and sintered in a similar condition. But it is difficult to adjust the atmosphere in the sintering process to an appropriate oxygen partial pressure. In layering a plurality of substrates one on the other, it is necessary to sinter each copper paste repeatedly after each copper paste is printed and thus lead time is long. As a result, the cost for installing equipments is high (Japanese Patent Laid-Open Publication No. 57-53321). In order to overcome this disadvantage, a method for manufacturing a ceramic multi-layer substrate is disclosed in Japanese Patent No. 5-1774496. This method comprises a binder-burn-out process, a reduction process, and a firing process. That is, a multi-layer substrate is manufactured with CuO serving as a starting material of a conductor. In the binder-burn-out process, heat treatment is performed in an oxygen atmosphere suitable at a temperature high enough to thermally decompose the organic binder contained in the multi-layer substrate. In the reduction process, CuO is reduced to Cu. In the firing process, the substrate is sintered. In this manner, the atmosphere can be controlled easily in the firing process and a fine sintered substrate can be obtained.

In the firing process, the ceramic multi-layer substrate shrinks due to the sintering. The degree of shrinkage which occurs due to the sintering is different from each other according to the material of the substrate, the composition of a green sheet, and the lot number of the powder. This method has the following problems. The first problem is that if the shrinkage error of the material of the substrate is great, a wiring pattern of the uppermost layer cannot be connected with electrodes of the inner layers due to a dimension error therebetween because as described above, in the manufacture of the multi-layer substrate, the wiring of the uppermost layer is formed after metals of the inner wirings are fired. As a result, it is necessary to form a land having a large area, more than is required, on the electrode of the uppermost layer so as tolerate a shrinkage error which will be made by the shrinkage. Thus, it is difficult to form on the ceramic multi-layer substrate a circuit requiring wiring of a high density. Therefore, a plurality of screen plates for use in the wiring of the uppermost layer is prepared in accordance with the degrees of shrinkage errors so that the screen plates are selectively used according to the degree of shrinkage of the substrate. This method requires many screen plates and is hence uneconomical.

Co-firing the wiring of the uppermost layer and that of the inner layer eliminates the need for the formation of the large land. But this method does not eliminate the shrinkage error of the substrate itself. In cream solder and printing in mounting parts on the substrate, there is a case in which the shrinkage error may not allow printing to be performed on a necessary portion and in addition, parts are not mounted on a predetermined mounting position.

Secondly, in the multi-layer substrate to be formed by layering green sheets one on the other, the degree of shrinkage of the multi-layer substrate in a widthwise direction thereof is different from that in a lengthwise direction thereof, depending on a film-forming direction of the green sheet. This is an obstacle in manufacturing the ceramic multi-layer substrate.

In order to reduce the shrinkage error as greatly as possible, it is necessary to control the composition of the multi-layer substrate and that of the green sheet, the difference in the lot number of the powder or lamination condition such as pressure and temperature in manufacturing the multi-layer substrate. Generally, it is said that the error in the degree of shrinkage is approximately ±0.5%.

This is a problem of not only the multi-layer substrate ceramic, but also of glass/ceramic which is sintered. In order to solve this problem, the following method is proposed in Japanese Patent Laid-Open Publication No. 5-102666. According to this method, green sheets, comprising glass/ceramic to be sintered at a low temperature, on which electrode patterns have been formed are laminated in a desired number one on the other. Then, green sheets disposed at the upper and/or lower end of the layered green sheets are covered with green sheets comprising inorganic compounds not sintered at the firing temperature of the material of the glass/ceramic substrate to be sintered at a low temperature. Thereafter, the layered green sheets are fired. Then, the inorganic compounds are removed from the layered green sheets. In this manner, the material of the substrate is sintered vertically and does not shrink horizontally and thus the above-described problems can be solved.

This method for forming a substrate has, however, the following problems: An electrode comprising such a conventional paste compound as described above has a porous structure because in firing the substrate, the substrate shrinks vertically. The electrode having a porous structure does not adhere to the substrate strongly. Consequently, there is a possibility that electrode is removed from the substrate or easily oxidized because the electrode is exposed to outside air in a great area. It is conceivable to carry out a method of increasing the mixing ratio of a conductive material or reduce the diameter thereof so as to form an electrode having a fine structure. According to this method, the conductive material starts to sinter earlier than the substrate in firing the glass/ceramic multi-layer substrate. Therefore, the substrate is incapable of preventing the conductive material from sintering. As a result, the substrate is crackled at a portion in the vicinity of the electrode.

In order to form the glass/ceramic substrate which does not shrink horizontally, it is necessary to use a conductive paste suitable for the substrate.

SUMMARY OF THE INVENTION

It is accordingly an object of the present invention to provide conductive ink to form a reliable electrode on a glass/ceramic multi-layer substrate which does not shrink horizontally.

In accomplishing these and other objects of the present invention, there is provided conductive ink comprising: an inorganic compound comprising 70.0–95.0 wt. % of CuO which is conductive and 5.0–30.0 wt. % of inorganic binder mixed with each other; and solvent and organic binder in which the inorganic compound is dispersed.

The inorganic binder consists of lead borosilicate crystalline glass or aluminum borosilicate crystalline glass which soften and crystallizes at 850°–950° C.

The diameter of CuO powder of the inorganic compound is 1.0–7.0 $\mu$m.

The diameter of the lead borosilicate crystalline glass powder or the aluminum borosilicate crystalline glass powder of the inorganic compound is 1.0–5.0 $\mu$m.

The organic binder consists of ethyl cellulose or copolymer of polyisobytylmethacrylate and poly$\alpha$-methylstyrene.

The conductive ink contains the organic binder at 0.5–2.0 wt. %.

According to the above construction, the substrate is not cracked in the vicinity of the electrode when the conductive ink is formed into the electrode on the glass/ceramic multi-layer substrate which does not shrink horizontally. Further, the electrode film has a dense structure and the electrode can be adhered to the substrate in a high strength.

CuO and the inorganic binder are mixed with each other in the above ratio, and the diameter of CuO powder of the inorganic compound is set to 1.0–7.0 $\mu$m and the diameter of the inorganic binder, namely, the lead borosilicate crystalline glass or aluminum borosilicate crystalline glass of the inorganic compound is set to 1.0–5.0 $\mu$m. In this manner, copper can be prevented from being sintered at a high speed. The glass serving as the inorganic binder has a high softening point and thus does not soften until the glass/ceramic substrate is sintered. Therefore, the electrode is not sintered until the glass/ceramic substrate is sintered. That is, after the glass/ceramic substrate is sintered, the glass softens and starts to be sintered. Accordingly, the electrode has a dense film structure, and the substrate is not cracked in the vicinity of the electrode. Further, the organic binder is mixed with the inorganic powders in an appropriate ratio. Thus, the conductive ink does not form sag or deficiency when it is printed in the form of fine lines.

DETAILED DESCRIPTION OF THE INVENTION

Before the description of the present invention proceeds, it is to be noted that like parts are designated by like reference numerals throughout the accompanying drawings.

FIRST EMBODIMENT

Conductive ink according to a first embodiment of the present invention is described below with reference to Table 1.

Conductive ink according to the first embodiment of the present invention comprises inorganic powders 79.62 wt. % of inorganic powders and organic media consisting of 1.63 wt. % of ethyl cellulose (manufactured by Nisshin Chemical Co., Ltd.) and 18.75 wt. % of Terpineol (manufactured by Kanto Chemical Co., Ltd). The inorganic powders consist of CuO (average particle diameter: 4.5 $\mu$m) and glass frit (manufactured by Coning Japan Co., Ltd., aluminum borosilicate crystalline glass, average diameter: 3.0 $\mu$m, softening point: 928° C.). Table 1 shows the compositions of six kinds of inorganic powders in which the mixing ratio between CuO and the glass were changed.

TABLE 1

| composition (wt %) of inorganic powder | | Adhesive strength |
|---|---|---|
| CuO | Glass | (kg/2mm²) |
| 95.25 | 4.75 | 1.42 |
| 95.00 | 5.00 | 2.38 |
| 90.00 | 10.00 | 2.60 |
| 80.00 | 20.00 | 2.74 |
| 70.00 | 30.00 | 2.41 |
| 69.75 | 30.25 | 1.92 |

In order to form six kinds of CuO inks, the mill base consisting of each composition shown in Table 1 was kneaded by roll mill so that each mixture had an appropriate viscosity. By using a CuO ink, printing was carried out by a screen printer on green sheets of glass/ceramic to be sintered at a low temperature. A required number of green sheets on which CuO patterns had been printed were layered on each other with alumina green sheets stacked the uppermost and lowermost green sheets. The layered green sheets were thermally compressed to each other at a temperature of 80° C. and a pressure of 200 Kg/cm². The laminated plate was maintained at 500° C. for two hours in a box-shaped oven containing air so as to burn-out organic binder from the laminated plate. Then, the laminated plate was maintained at 400° C. for five hours in a reduction oven containing 100% hydrogen so as to carry out the reduction of CuO. Then, the laminated plate was fired at 950° C. for one hour in a mesh belt oven containing pure nitrogen. In this manner, ceramic multi-layer substrates were obtained. The adhersion strengths of electrodes disposed on the upper surface of each substrate were evaluated.

METHOD OF EVALUATING CAPABILITY

Adhersion strength: Patterns of conductive films of 2 mm×2 mm were printed on a substrate at 12 portions thereof and the substrate was fired by the process of the first embodiment. Then, cream solder was put on the patterns and then, pins of phosphor bronze were gold-plated at 350° C. at a belt speed of 0.6 m/min in a reflow oven of belt heat-transmission type. Thereafter, the pins were attached to the conductive films. A test machine was used to apply force to the pins in a direction perpendicular thereto so as to measure the adhersion strengths of the conductive films.

As shown in Table 1, the adhersion strengths of the conductive films were more than 2 kg/2 mm² when the glass was contained in the inorganic powders at 5-30 wt. %, whereas the adhersion strengths were low when the glass was contained in the inorganic powders at less than 5 wt. %. The adhersion strength was not improved greatly when the weight percentage of the glass was more than 30 wt. %. That is, inorganic powders containing CuO at 70.0-95.0 wt. % and the glass at 5.0-30.0 wt. % allow the adhersion strength to be more than 2 kg/2 mm². Most favorably, the inorganic powders consists of 80.0 wt. % of CuO and 20.0 wt. % of the glass serving as the inorganic binder.

SECOND EMBODIMENT

Conductive ink according to a second embodiment of the present invention is described below with reference to Table 2. Conductive ink according to the second embodiment comprises inorganic powders 79.62 wt. % of inorganic powders and organic media consisting of 1.63 wt. % of ethyl cellulose (manufactured by Nisshin Chemical Co., Ltd.) and 18.75 wt. % of Terpineol (manufactured by Kanto Chemical Co., Ltd). The inorganic powders consist of 70.0 wt. % of CuO (average particle diameter: 5.5 μm) and 30.0 wt. % of glass frit (manufactured by Nippon Electric Glass Co., Ltd., lead borosilicate crystalline glass, average diameter: 5.0 μm). Table 2 shows the softening points of six kinds of glasses used in the second embodiment.

TABLE 2

| Softening point of glass (°C.) | State of electrode | crack |
| --- | --- | --- |
| 800 | dense | occurred |
| 840 | dense | occurred |
| 850 | dense | not occurred |
| 900 | dense | not occurred |
| 950 | dense | not occurred |
| 960 | coarse | not occurred |

In order to form the six kinds of CuO inks, the mill base consisting of each composition shown in Table 2 was kneaded by a roll mill so that each mixture had an appropriate viscosity. By using CuO ink, printing was carried out by a screen printer on green sheets of glass-/ceramic to be sintered at a low temperature. A required number of green sheets on which CuO patterns had been printed were layered on each other with alumina green sheets stacked the uppermost and lowermost green sheets. The layered green sheets were thermally compressed to each other at a temperature of 80° C. and a pressure of 200 Kg/cm². The laminated plate was maintained at 500° C. for two hours in a box-shaped oven containing air so as to remove organic binder from the laminated plate. Then, the laminated plate was maintained at 400° C. for five hours in a reduction oven containing 100% hydrogen so as to carry out the reduction of CuO. Then, the laminated plate was fired at 950° C. for one hour in a mesh belt oven containing pure nitrogen. In this manner, ceramic multi-layer substrates were obtained. The states of conductive electrodes and whether or not the substrate were crackled in the vicinity of the electrodes were observed by means of an SEM (scanning electron microscope). As shown in Table 2, the substrate were crackled in the vicinity of the electrodes when the softening point of the glass was less than 850° C. When the softening point of the glass was more than 950° C., the electrodes were not sintered to a desired degree and hence, the structures of the electrode films were porous. That is, when the softening point of the glass serving as the inorganic binder is 850° C.–950° C., the substrates are not crackled and the structures of the electrode films are porous.

THIRD EMBODIMENT

Conductive ink according to a third embodiment of the present invention is described below with reference to Table 3. Conductive ink according to the third embodiment comprises inorganic powders and organic media. The inorganic powders consist of 90.0 wt. % of CuO (average particle diameter: 3.5 μm) and 10.0 wt. % of glass frit (manufactured by Nippon Electric Glass Co., Ltd., lead borosilicate crystalline glass, average diameter: 2.0 μm, softening point: 930° C.). The organic media consist of ethyl cellulose (manufactured by Nisshin Chemical Co., Ltd.) and Terpineol (manufactured by Kanto Chemical Co., Ltd). Table 3 shows the compositions of seven kinds of inks. In order to form the seven samples of CuO inks, the mill base of each composition shown in Table 3 was kneaded by a roll mill so that each mixture had an appropriate viscosity.

TABLE 3

| | Composition (wt %) of conductive ink | | |
| --- | --- | --- | --- |
| | Composition of | Composition of organic media | |
| Sample | inorganic powder | Ethyl cellulose | Terpineol |
| 1 | 95.00 | 0.40 | 4.60 |
| 2 | 93.21 | 0.54 | 6.25 |
| 3 | 86.42 | 1.08 | 12.50 |
| 4 | 79.62 | 1.63 | 18.75 |
| 5 | 75.00 | 2.00 | 23.00 |
| 6 | 71.25 | 2.30 | 26.45 |
| 7 | 68.75 | 2.50 | 28.75 |

By using CuO ink, printing was carried out by a screen printer on green sheets of glass/ceramic to be sintered at a low temperature. As a result, it was found that printed lines made of ink of samples 2 through 5 were linearly formed, i.e., had neither sag nor deficiency, whereas printed lines made of ink of samples 1, 6 and 7 had sags and deficiencies. A required number of green sheets on which CuO patterns had been printed were layered on each other with alumina green sheets stacked on the uppermost and lowermost green sheets. The layered green sheets were thermally compressed to each other at a temperature of 80° C. and a pressure of 200 Kg/cm². The laminated plate was maintained at 500° C. for two hours in a box-shaped oven containing air so as to remove organic binder from the laminated plate. Then, the laminated plate was maintained at 400° C. for five hours in a reduction oven containing 100% hydrogen so as to carry out the reduction of CuO. Then, the laminated plate was fired at 950° C. for one hour in a mesh belt oven containing pure nitrogen. In this manner, ceramic multi-layer substrates were obtained. The states of the electrodes were observed by means of an SEM (scanning electron microscope). As a result, it was found that conductive films made of the inks of the samples 1 through 5 had dense structures, whereas conductive films made of the inks of samples 6 and 7 had porous structures. The inks of the samples 2 through 5 containing 0.5–2.0 wt. % of the organic binder could be printed favorably and formed into dense conductive films. The ink of the sample 2 containing 1.63 wt. % of the organic binder was most favorable.

The average diameters of powders of CuO used in the first, second, and third embodiments were 5.5 μm, 4.5 μm, 3.5 μm, respectively. The average diameters of powders of the inorganic binder used in the first, second, and third embodiment were 5.0 μm, 3.0 μm, 2.0 μm, respectively. But it is possible to use CuO powder having an average diameter of 1.0–7.0 μm and inorganic binder powders having an average diameter of 1.0–5.0 μm.

Copolymer of polyisobytylmethacrylate and polya-methylmethacrylate may be used as the organic binder instead of ethyl cellulose, Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A conductive ink comprising an inorganic compound consisting essentially of 70.0–95.0 wt. % of a CuO powder which is conductive and 5.0–30.0 wt. % of inorganic binder powder mixed therewith; and a solvent and an inorganic binder in which the organic compound is dispersed, said inorganic binder consisting of lead borosilicate crystalline glass powder or alumina borosilicate crystalline glass powder, which crystalline glass powders crystallize at 850°–950° C.

2. A conductive ink as defined in claim 1, wherein the diameter of the CuO powder of the inorganic compound is 1.0–7.0 μm.

3. A conductive ink as defined in claim 1, wherein the diameter of the lead borosilicate crystalline glass powder or the aluminum borosilicate crystalline glass powder of the inorganic compound is 1.0–5.0 μm.

4. A conductive ink as defined in claim 1, wherein the organic binder consists of ethyl cellulose or copolymer of polyisobytylmethacrylate and polyα-methylstyrene.

5. A conductive ink, as defined in claim 1, containing the organic binder in amounts of 0.5–2.0 wt. %.

* * * * *